United States Patent
Bulovic et al.

(10) Patent No.: US 8,963,262 B2
(45) Date of Patent: Feb. 24, 2015

(54) METHOD AND APPARATUS FOR FORMING MEMS DEVICE

(75) Inventors: Vladimir Bulovic, Lexington, MA (US); Corinne E. Packard, Lakewood, CO (US); Vanessa C. Wood, Zurich (CH); Apoorva Murarka, Cambridge, MA (US); Gleb Akselrod, Cambridge, MA (US)

(73) Assignee: Massachusettes Institute of Technology, Cambridge, MA (US)

( * ) Notice: Subject to any disclaimer, the term of this patent is extended or adjusted under 35 U.S.C. 154(b) by 308 days.

(21) Appl. No.: 12/903,149

(22) Filed: Oct. 12, 2010

(65) Prior Publication Data

US 2011/0254107 A1   Oct. 20, 2011

Related U.S. Application Data

(63) Continuation-in-part of application No. 12/537,424, filed on Aug. 7, 2009, now Pat. No. 8,232,136, which is a continuation-in-part of application No. 12/636,757, filed on Dec. 13, 2009.

(60) Provisional application No. 61/251,255, filed on Oct. 13, 2009.

(51) Int. Cl.
   *H01L 29/84*   (2006.01)

(52) U.S. Cl.
   USPC .................................. 257/415; 257/E29.324

(58) Field of Classification Search
   USPC .......................................... 257/415, E29.324
   See application file for complete search history.

(56) References Cited

U.S. PATENT DOCUMENTS

| 4,266,263 | A | 5/1981 | Haberl et al. | |
|---|---|---|---|---|
| 5,862,239 | A * | 1/1999 | Kubli et al. | 381/356 |
| 6,160,828 | A | 12/2000 | Kozlov et al. | |
| 6,243,474 | B1 * | 6/2001 | Tai et al. | 381/174 |
| 6,294,398 | B1 | 9/2001 | Kim et al. | |

(Continued)

FOREIGN PATENT DOCUMENTS

| DE | 10 2007-16995 | 10/2008 |
|---|---|---|
| WO | WO 2003-073164 | 9/2003 |
| WO | WO 2004-107403 | 12/2004 |
| WO | WO 2008/133942 | 11/2008 |
| WO | WO 2009/096419 | 8/2009 |

OTHER PUBLICATIONS

Hanseup Kim et al., "Characterization of Aligned Wafer-Level Transfer of Thing and Flexible Parlene Membranes", *Journal of Microelectromechanical Systems*, Dec. 1, 2007, vol. 16, No. 6, pp. 1386-1396.

(Continued)

*Primary Examiner* — Evan Pert
(74) *Attorney, Agent, or Firm* — The Salehi Law Group

(57) ABSTRACT

The disclosure is generally directed to fabrication steps, and operation principles for microelectromechanical (MEMS) transducers. In one embodiment, the disclosure relates to a texture morphing device. The texture morphing device includes: a plurality of supports arranged on a substrate to support a deformable mirror; an ITO layer; and a Distributed Bragg Reflector (DBR) layer. A pair of adjacent supports form a cavity with the ITO layer and the deformable mirror. When the height of the cavity changes responsive to an external pressure, the internal reflection within the cavity is changed. The change in the height of the cavity causes the exterior texture to morph. Similar principles are disclosed for constructing sensor and actuators.

12 Claims, 17 Drawing Sheets

(56) References Cited

U.S. PATENT DOCUMENTS

| | | | |
|---|---|---|---|
| 6,444,400 | B1 | 9/2002 | Cloots et al. |
| 6,472,962 | B1 | 10/2002 | Guo et al. |
| 6,498,802 | B1 | 12/2002 | Chu et al. |
| 6,586,763 | B2 | 7/2003 | Marks et al. |
| 7,047,814 | B2 * | 5/2006 | Zias et al. ............ 73/718 |
| 7,305,890 | B2 * | 12/2007 | Zias et al. ............ 73/780 |
| 7,346,981 | B2 | 3/2008 | Borwick et al. |
| 7,406,761 | B2 | 8/2008 | Jafri et al. |
| 7,439,093 | B2 * | 10/2008 | Beaudry ............ 438/48 |
| 7,816,710 | B2 * | 10/2010 | Palmateer et al. ............ 257/257 |
| 7,836,574 | B2 | 11/2010 | Jafri et al. |
| 2002/0045105 | A1 | 4/2002 | Brown et al. |
| 2004/0004988 | A1 | 1/2004 | Cok et al. |
| 2004/0056244 | A1 | 3/2004 | Marcus et al. |
| 2005/0230348 | A1 | 10/2005 | Kido |
| 2006/0048885 | A1 | 3/2006 | Constantin |
| 2010/0288635 | A1 | 11/2010 | Komiya et al. |

OTHER PUBLICATIONS

Meitl et al., "Transfer Printing by Kinetic Control of Adhesion to an Elastometric Stamp," *Nature Materials Nature Publishing Group UK*, vol. 5, No. 1, Jan. 2006, pp. 33-38.

International Preliminary Report on Patentability issued on Oct. 6, 2009 for PCT Application No. PCT/US09/030151.

International Preliminary Report on Patentability issued on Feb. 8, 2011 for PCT Application No. PCT/US09/053086.

International Search Report and Written Opinion dated Mar. 29, 2010 issued for PCT Application No. PCT/US2009/056267.

International Search Report and Written Opinion dated Dec. 10, 2010 issued for PCT Application No. PCT/US2009/067801.

International Search Report dated Jun. 16, 2011 for Application No. PCT/US2010/052403.

\* cited by examiner

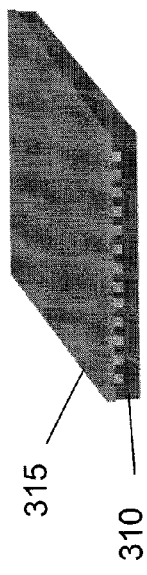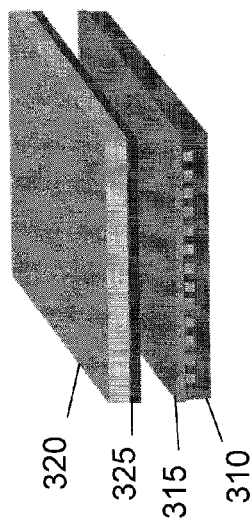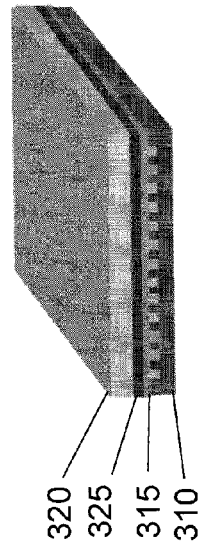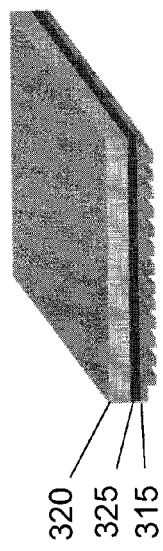
Fig. 3A
Fig. 3B
Fig. 3C
Fig. 3D

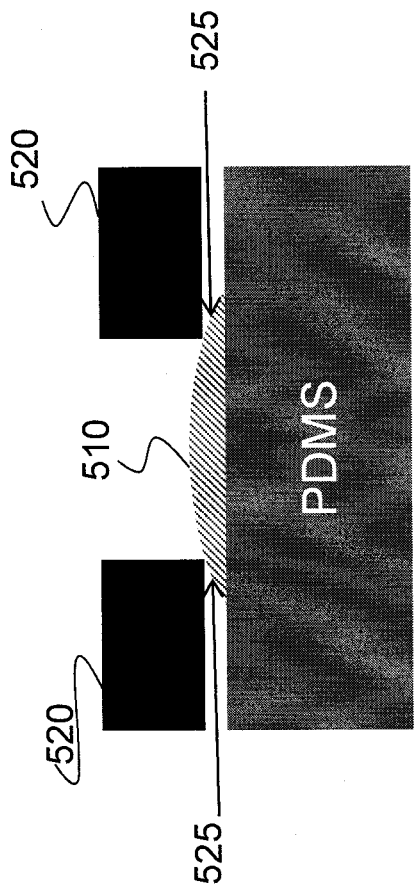
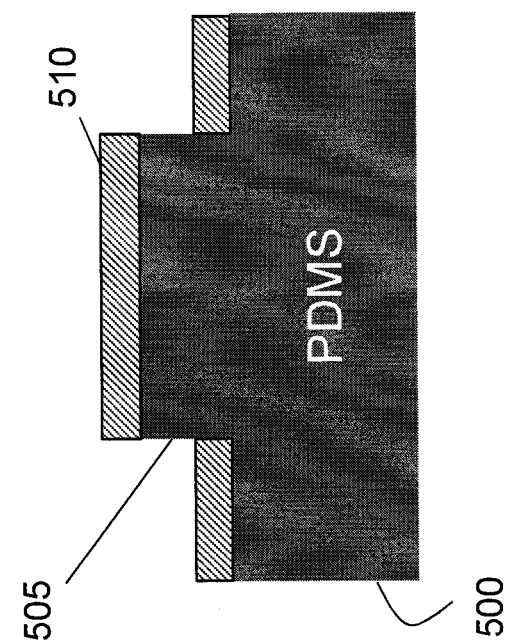
Fig. 5B
(Prior Art)
Fig. 5A

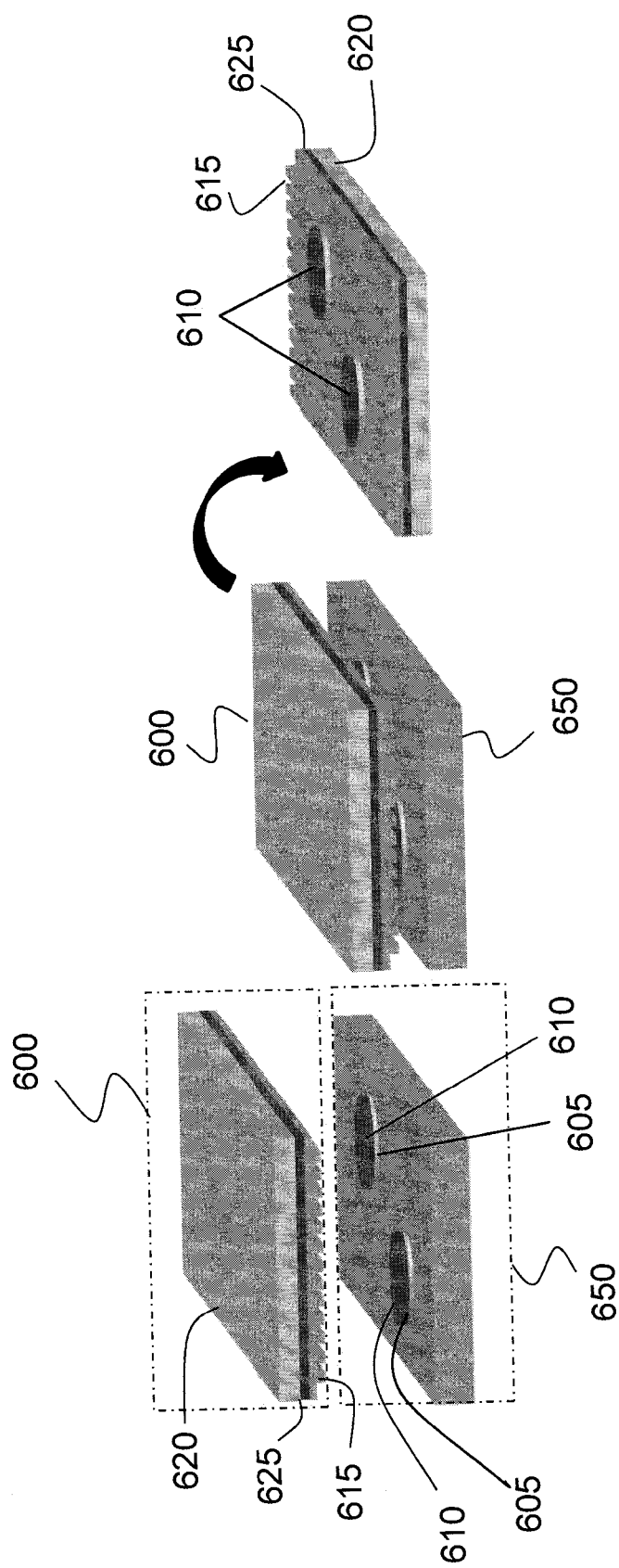

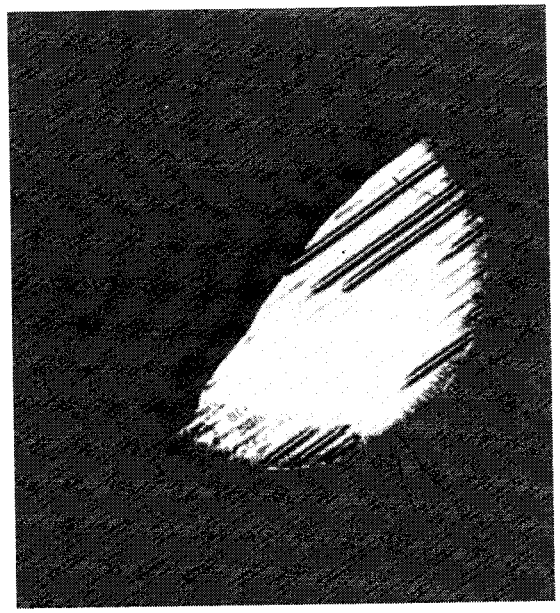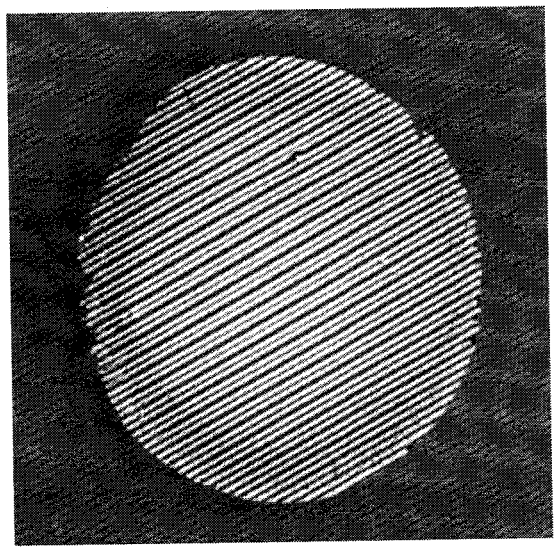
Fig. 13

METHOD AND APPARATUS FOR FORMING MEMS DEVICE

The application claims the filing-date priority of Provisional Application No. 61/251,255, filed Oct. 13, 2009, the disclosure of which is incorporated herein in its entirety; the application is also a continuation-in-part of U.S. patent application Ser. No. 12/537,424 filed Aug. 13, 2007; and is a continuation-in-part of application Ser. No. 12/636,757 filed Dec. 13, 2009. The disclosure of the foregoing applications are incorporated herein in their entirety for background information.

BACKGROUND

1. Field of the Invention

The disclosure relates to a method and apparatus for forming microelectromechanical systems ("MEMS") devices. More specifically, the disclosure relates to forming highly sensitive detection and actuation apparatus using, among others, contact transfer method described herein.

2. Description of Related Art

MEMS applied over large areas would enable applications in such diverse areas as sensor skins for humans and vehicles, phased array detectors and adaptive-texture surfaces. MEMS can be incorporated into large area electronics. Conventional photolithography-based methods for fabricating MEMS have provided methods and tools for producing small features with extreme precision in processes that can be integrated with measurement and control circuits. However, the conventional methods are limited to working within the existing silicon semiconductor-based framework. Several challenges, including expense, limited size and form-factor, and a restricted materials set, prevent the future realization of new MEMS for applications beyond single chip or single sensor circuits. Standard processing techniques are particularly restrictive when considering expanding into large area fabrication. Conventional photolithography methods are also incompatible with printing flexible substrate MEMS and micro-sized sensor arrays.

For example, in creating free-standing bridges, cantilevers or membranes from limited material, the conventional methods require surface or bulk micromachining, a series of photolithographic masking steps, thin film depositions, and wet chemical or dry etch releases. Such steps require investing in and creating highly specialized mask sets which render conventional photolithography expensive and time and labor intensive. While the initial investment can be recovered by producing large batches of identical MEMS devices, the conventional methods are cost prohibitive for small batches or for rapid prototype production.

Conventional MEMS have been based on silicon and silicon nitride which are deposited and patterned using known facile processes. Incorporating mechanical elements made of metal on this scale is difficult because of the residual stresses and patterning challenges of adding metal to the surface. This is because metals are resistant to aggressive plasma etching. As a result, conventional MEMS processing apply liftoff or wet chemical etching. The surface tension associated with drying solvent during these patterning steps or a later immersion can lead to stiction (or sticking) of the released structure. Stiction dramatically reduces the production yield.

Another consideration in some large area applications is flexibility. Although photolithography is suitable for defining high fidelity patterns on planar and rigid substrates, it is difficult to achieve uniform registration and exposure over large areas. Display technologies have been among the first applications to create a market for large area microelectronics. To meet the challenges of new markets for large area electronics, alternative means to patterning have been proposed which include: shadow masking, inkjet printing, and micro-contact printing. These techniques are often the only options available for organic semiconductors and other nanostructured optoelectronic materials, some of which have particularly narrow threshold for temperature, pressure and solvent. Conventional methods are not suitable for MEMS using organic semiconductors, nanostructured optoelectronic materials which may be fabricated on a flexible substrate.

An alternative approach is to fabricate electronic structures directly on flexible sheets, but polymeric substrates offering this flexibility are typically limited to low-temperature processing. Accordingly, high temperature processing such as thermal growth of oxides and the deposition of polysilicon on a flexible substrate cannot be supported by conventional processes. Another approach is to fabricate structures on silicon wafers, bond them to a flexible sheet, and then release the structures from the silicon by fracturing small supports or by etching a sacrificial layer. However, this approach tends to locate the structures on the surface having the highest strain during bending.

Therefore, there is a need for flexible, large area fabrication of MEMS that does not rely on photolithography nor requires harsh processing conditions.

SUMMARY

In one embodiment, the disclosure relates to a MEMS sensor capable of detecting minute changes in the environment. The changes can relate to sound, fluidic motion or any other ambient energy change impacting the sensor. An exemplary MEMS sensor comprises: a plurality of cavities projecting from a substrate, the plurality of cavities arranged in an array and each cavity having a hollow space below a surface of the substrate; a diaphragm layer formed over the array; a first electrode communicating with the diaphragm which forms the second electrode; a meter in communication with the first electrode and the second electrode, the meter detecting a capacitance change between the first electrode and the second electrode when the diaphragm is deflected.

In another embodiment, the disclosure relates to a MEMS sensor having a plurality of cavities (or holes) projecting from a substrate. The plurality of cavities can be arranged in an array with each cavity having a hollow interior separating a top portion and a bottom portion thereof. One or more diaphragm layers can be formed over the array. The first electrodes can communicate with the plurality of diaphragms forming a plurality of complementary electrodes. A meter in communication with the plurality of complementary electrodes detects a capacitance change between the complementary electrodes when an external signal affects the respective diaphragm. The external signal can be energy from a sound pressure in the audible or ultrasound frequency bands.

In still another embodiment, the disclosure relates to a tunable mirror. The tunable mirror comprises: a plurality of supports arranged on a substrate to support a deformable reflector; an ITO layer; and a Distributed Bragg Reflector (DBR) layer. The two adjacent supports form a cavity with the ITO layer and the deformable reflector. The height of the cavity can be adjusted to change an internal reflection within the cavity. The deformable reflector can further include a multilayer structure having a gold film, a silver film and DCM-doped organic dye layer. An organic dye can be selected to emit in at least one of UV, visible, or IR wavelengths.

In another embodiment, the disclosure relates to a texture morphing device. The texture morphing device uses a substantially similar structure but operates as an actuator. When operated as a pressure sensor, the diaphragm's geometry changes in response to changes in external pressure. The change in the diaphragm's shape (e.g., deflection) produces a voltage change which can be detected and correlated to a change in pressure. In contrast, the texture morphing device changes its shape (e.g., deflecting diaphragm) in response to a predefined input voltage. The input voltage can be calculated to produce the desired deformation in device texture.

In still another embodiment, the disclosure relates to a method for changing texture of a device by: forming an array of cavities on a substrate; forming a diaphragm over the array of cavities; mapping a plurality of regions of the array and correlating said regions a plurality of identified cavities; forming a closed circuit between at least one of the cavities in the array and the diaphragm; and supplying a bias to the closed circuit, the bias appraised to cause a deflection in the diaphragm thereby changing the texture of the device.

In yet another embodiment, the disclosure relates to a method for mapping a spatially resolved pressure. The method includes the steps of: forming an array of cavities on a substrate; forming a sensitive diaphragm over the array of cavities; mapping a plurality of regions of the array and correlating each region with a plurality of identified cavities. When external pressure is sensed, the diaphragm deflects in response to the pressure.

BRIEF DESCRIPTION OF THE DRAWINGS

These and other embodiments of the disclosure will be discussed with reference to the following exemplary and non-limiting illustrations, in which like elements are numbered similarly, and where:

FIGS. 3A-3D pictorially illustrate a method for fabricating a MEMS support structure;

FIG. 5A schematically illustrates a method for forming an organic release layer;

FIG. 5B, shows the result of a conventional shadow-masking process;

FIGS. 6A-6C show an exemplary processes for contact transfer of the components formed in FIGS. 3 and 4;

FIG. 6A schematically illustrates a MEMS structure pad and stamp structures;

FIG. 6B schematically illustrates the pad and stamp structure of FIG. 6A brought into contact;

FIG. 6C schematically illustrates the resulting MEMS structure after delamination;

FIG. 13 is an optical micrograph of the tunable emitter geometry formed by a multilayer transfer according to an embodiment of the disclosure.

DETAILED DESCRIPTION

Figure 1A:
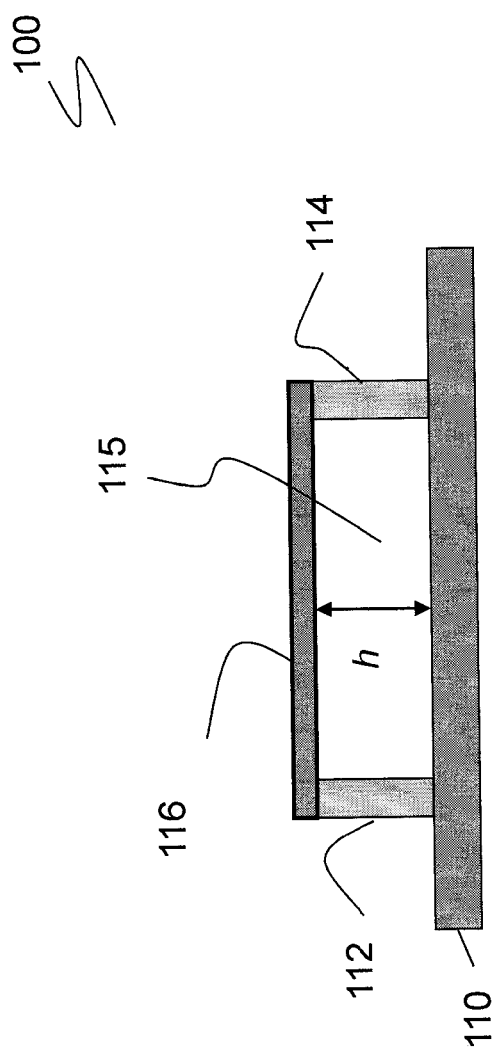
FIG. 1A is a schematic representation of a conventional MEMS device.

FIG. 1A is a schematic representation of a conventional MEMS device. MEMS 100 includes substrate 110 having supports 112 and 114. Supports 112 and 114 can be viewed as a plurality of ridges separated by gap 115. Supports 112 and 114 uphold layer 116. Gap 115 is defined by the separation distance between ridges 112 and by the height (h). Conventionally, layer 116 is defined by a metal layer and MEMS structure 100 is formed through photolithography as described above. As stated, the conventional processes lacked ability to produce MEMS devices over large areas and on flexible substrates.

Figure 1C:
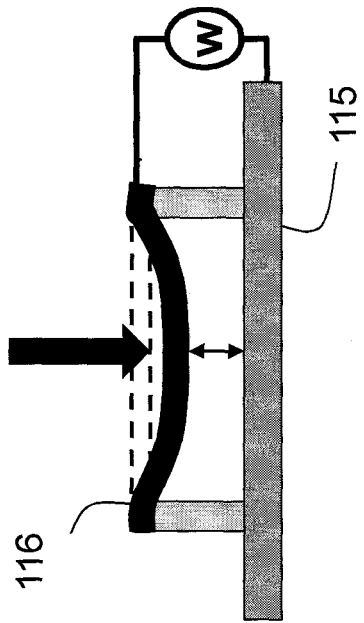
FIG. 1C shows an application of the MEMS device of FIG. 1A as a sensor.
Figure 1B:
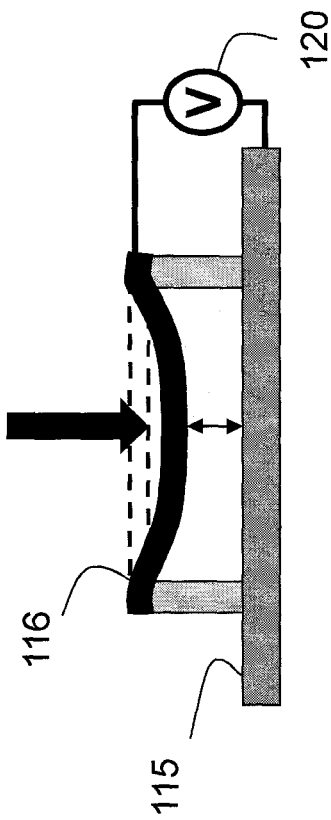
FIG. 1B shows an application of the MEMS device of FIG. 1A as an actuator.

FIG. 1B shows an application of the MEMS device of FIG. 1A used as an actuator. In FIG. 1B, structure 100 is connected to voltage source 120 through substrate 115 and diaphragm 116 which act as electrodes. The bias provided by voltage source 120 creates an electrostatic force between electrode 115 and layer 116, causing the latter to act as a diaphragm by deflecting towards electrode 115. The relationship between the electrostatic force and the deflection is described in Equation 1 as follows:

$$F_{el} \propto V^2/d^2 \quad (1)$$

In Equation 1, $F_{el}$ denotes the electrostatic force, V is the bias voltage and d is the separation distance between substrate 115 and metal layer 116. FIG. 1C shows an application of the MEMS device of FIG. 1A for use as a sensor. In FIG. 1C, external force $F_{ext}$ is applied to MEMS structure 100 causing deflection in metal layer 116. The external force is measurable as it creates a change in capacitance (C) of the MEMS device. The capacitance can be determined by Equation 2 as follows:

$$C \propto 1/d \quad (2)$$

Figures 2A, 2B, 2C:
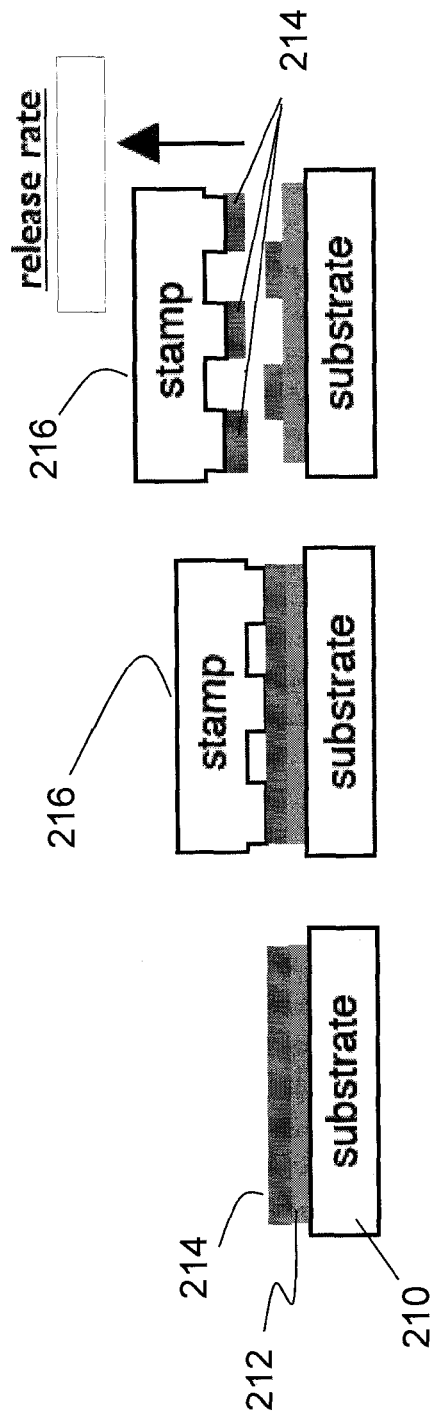
FIGS. 2A-2C are schematic representations of a method for manipulating thin films of metal.

FIGS. 2A-2C are schematic representations of a method for manipulating thin films of metal. The process starts in FIG. 2A by providing substrate 210 having thereon release layer 212 and metal film 214. Substrate 210 can comprise glass, plastic, silicon and other flexible or rigid film or bulk material. Release material 212 may include conventional release material. A preferred release layer comprises N,N'-diphenyl-N—N'-bis(3-methylphenyl)-(1,1'-biphenyl)-4,4'-diamine ("TPD") having a thickness of about 90 nm. The metal layer preferably comprises a material capable of acting as an electrode. Metal layer 214 can be a gold layer with a thickness of about 140 nm. The metal layer can be deposited, for example, through shadow masking over the release layer.

In FIG. 2B, a MEMS structure (i.e., stamp 216) having a support layer and a plurality of ridges is provided. The MEMS structure is prepared as a function of its intended use. A common MEMS structure which is used in applications ranging from pressure sensor to array detectors includes a base layer supporting a plurality of ridges. The ridges can be spaced apart such that each pair of adjacent ridges is separated by a gap. In one embodiment of the invention, the gap is about 5-50 micrometers. In FIG. 2C, the stamp is lifted from the substrate, lifting with it a layer of release material. The release rate can be fast or slow depending on a number of variables.

Successful patterning also depends on the film thickness. In one embodiment of the disclosure thin metal films having a thickness of less than 20 nm replicated features as small as 13 µm. Thicker metal films having thickness in excess of about 100 nm can be resistant to patterning. Instead, these thick films are seen to produce continuous film transfer across discontinuous stamp surfaces. By engineering the transfer process according to the film thickness, the suspended membranes and bridges which are used in many MEMS devices can be created in an additive process, termed contact transfer.

FIGS. 3A-3D illustrate a method for fabricating a MEMS support structure. In FIG. 3A, a MEMS support material such as an elastomeric polymer 315 is molded into a master mold 310. The elastomeric polymer can be PDMS. The mold can be of any shape. In a preferred embodiment, the mold is designed to produce a MEMS structure with a base layer supporting a plurality of ridges. Next, an electrode-coated substrate is brought into contact with PDMS layer 310. In FIG. 3B, the electrode-coated substrate comprises electrode 325 and substrate 320. Substrate 320 can include glass, plastic, or other conventional substrate material. Among others, electrode 325 can comprise conductive material such as gold, silver and Indium Tin Oxide (ITO). One or more conductive layers can be deposited by thermal evaporation or sputtering. In FIG. 3C, the PDMS is cured to form a solid structure. In an embodiment, PDMS was cured at 50° C. for about one hour. Other conventional curing methods can be equally used without departing from the principles of the disclosure. Finally, in FIG. 3D, mold 310 is removed from the cured MEMS support structure 300. MEMS supports structure 300 includes substrate 320, electrode 325 and PDMS 315. Once the MEMS support structure is prepared, one or more thin layers of electrodes are deposited over the PDMS ridges according to the principles disclosed herein.

Figure 4A:
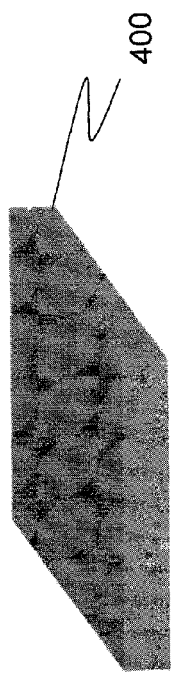
FIGS. 4A-4D pictorially illustrate a method for fabricating a transfer support structure for depositing an electrode layer over the PDMS ridges.
Figure 4B:
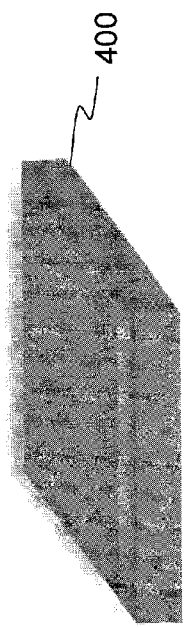
Figure 4C:
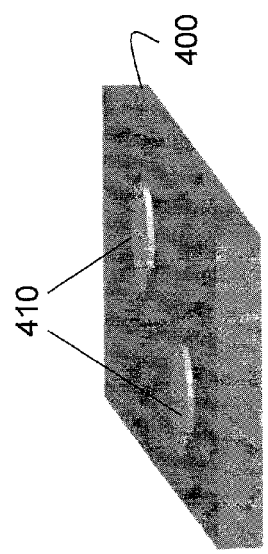
Figure 4D:
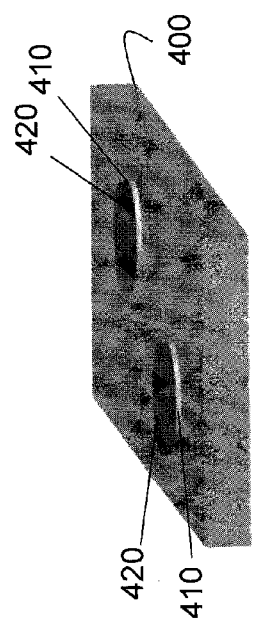

FIGS. 4A-4D illustrate a method for fabricating a transfer support structure for depositing an electrode layer over the PDMS ridges. In FIG. 4A, substrate 400 is provided to receive the metal film. Substrate 400 can comprise PDMS. In FIG. 4B, substrate 400 is treated with oxygen plasma. In FIG. 4C, an organic release layer is defined by evaporation through a shadow mask to form a release layer 410 on substrate 400. The organic release layer can also be formed by features in the PDMS designed to interrupt growth of a continuous film as described below. In one embodiment, the release layer comprises TPD at a thickness of about 90 nm. Release layer 410 can be thermally evaporated onto substrate 400 through a shadow mask. In FIG. 4D, metal layer 420 is deposited over release layer 410. In one embodiment, the metal layer is deposited by evaporating the metal electrode through the same shadow mask used for thermally depositing release layer 410. In one embodiment, the metal layer can be gold, silver or alloys thereof.

Once the MEMS structure and the support structure have been prepared, the MEMS structure can be brought into conformal contact with the support structure so as to form an adhesive bond between the ridges (or the tops of the ridges) of the MEMS structure and the metal layer on the support structure. After forming the adhesive bond, the MEMS structure may be peeled from the support structure to delaminate substantially all of the metal layer on top of the support structure. In practice, a portion of the release layer interposed between the metal layer and the substrate adheres to the metal layer and is delaminated from the support structure. The critical peeling velocity may depend on such factors as the size, thickness and the composition of the metal layer. In one embodiment of the invention, a peeling velocity of about 3-6 m/sec. was found sufficient to delaminate all of the metal layer from the support structure.

As discussed, the organic release layer can also be formed by features in the PDMS designed to interrupt growth of a continuous film as described below. FIG. 5A schematically illustrates a method for forming an organic release layer. In FIG. 5, PDMS 500 is formed by molding a PDMS substrate to create raised feature 505. Because thermal evaporation is a so-called line-of-sight process, it cannot be conformally coated over the steep edges of the raised feature 505. This results in a discontinuous film of metal or organic on the PDMS. In FIG. 5A, film 510 is a thermally evaporated layer of organic material or metal. The raised feature 505 defines the shape of the film that is to be released. When the transfer substrate (PDMS with organic and/or metal layers) is brought into contact with the device substrate, only the raised areas of the transfer substrate contact the device substrate, thus metal films that are the shape of the original raised features are transferred. Using the geometry of the PDMS pad to define the shape of the transfer films results in a significantly crisper edges and tighter corners. FIG. 5B, shows the result of a conventional shadow-masking process. In contrast to FIG. 5A, shadow-masking results in a diffused edge 525 because of deflection of the evaporative flux off of the finite thickness shadow mask 520.

FIGS. 6A-6C show an exemplary processes for contact transfer of the components formed in FIGS. 3 and 4. The MEMS structure prepared in FIG. 3 and the support structure prepared in FIG. 4 were used to illustrate the process of FIGS. 6A-6C. MEMS structure 600 includes substrate 620, electrode 625 and PDMS 615. PDMS 615 is defined by proximal and distal sides. The proximal side of PDMS 615 faces electrode 625. The distal side of PDMS 615 includes a plurality of ridges (or raised features) which are spaced apart. Support structure 650 includes release layer 605 and metal layer 610. MEMS structure 600 and support structure 650 are brought into conformal contact in FIG. 6B. Each of the ridges formed on the distal end of PDMS 615 contacts metal layer 620. The duration of the contact can be a function of the metal layer and the pressure applied.

In FIG. 6C, MEMS structure 600 after it is peeled off from the support structure 650 of FIG. 6B. A portion of the release 605 may also be removed (not shown in FIG. 6C) along with the delaminated metal layer and transferred over to the MEMS structure 600. Conventional methods can be used to remove any excess release material transferred over to the MEMS structure 600 if desired or required. Once metal layer 610 is transferred to the MEMS structure, the metal layer adheres to the ridges at the distal end of PDMS 615. Transfer can also be achieved by placing a relief patterned with viscoelastic PDMS ridges in contact with the planar metal layer, and peeling off the stamp quickly, increasing the weak adhesion energy of the elastomer to the metal.

A rapid peel rate can enhance adhesive forced between metal layer 610 and elastomeric features of the layer to provide transfer when the MEMS structure is lifted away. A rapid peel rate of about 5 msec enhances the adhesion between a viscoelastic polymer (in this case, PDMS) and silicon component sufficiently to allow these components to be lifted from the substrate. Below a critical threshold peel rate, the increase in adhesive force will not be sufficient to delaminate the metal film from the release layer. The peel rate depends on, for example, metal thickness, support geometry, release layer and the composition of the metal film.

Figure 7A:
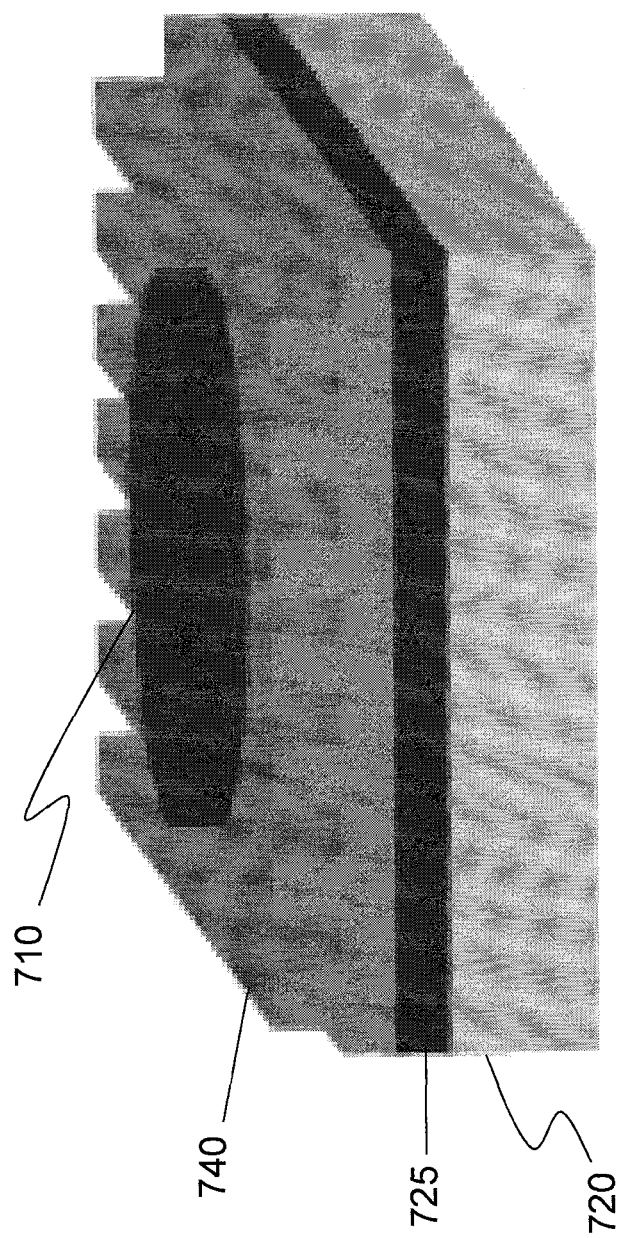
FIG. 7A schematically illustrates the MEMS structure formed according to the process of FIGS. 6A-6C.
Figure 7B:
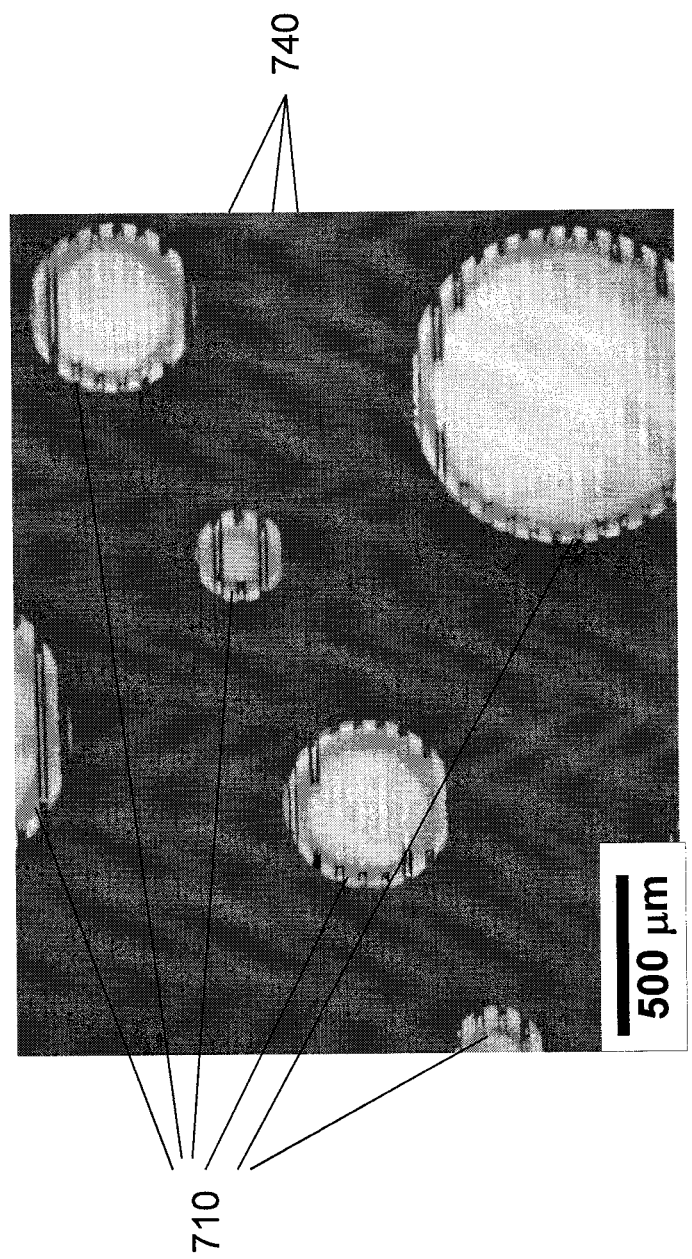
FIG. 7B is a microscopic image of an actual gold electrodes over a MEMS structure.
Figure 7C:
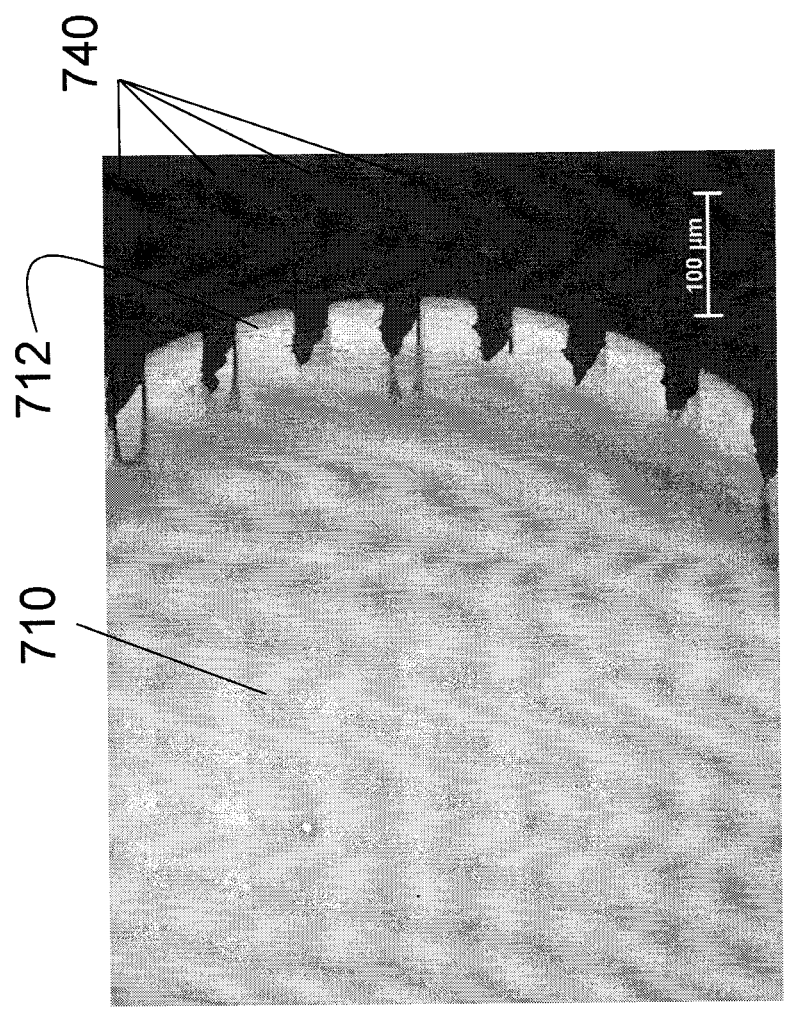
FIG. 7C is an exploded view of the MEMS structure of FIG. 7B.

FIG. 7A schematically shows the MEMS structure prepared according to the process of FIG. 6. The MEMS structure includes substrate 720 which supports electrode 725. PDMS grating 740 is formed over the substrate. The transferred membrane (interchangeably, diaphragm) 710 completes the MEMS structure providing a suspended diaphragm over grating 740. In one implementation of the disclosure, a gold layer was used as a diaphragm having a thickness of about 140 nm. FIG. 7B is an exploded view of the MEMS structure of FIG. 7A. The transferred gold membrane 710 is spread over the ridges 740 of a MEMS support structure. The largest gold membrane which appears on the lower right hand side of FIG. 7B had a 1 mm diameter. FIG. 7C is an exploded view of the MEMS structure of FIG. 7B, showing PDMS support ridges 640 supporting gold membrane 710. Edges 712 of membrane 710 are thinner than its central regions thereof resulting in limited transfer over the gaps. Edges 712 are formed as a result of shadow masking.

It should be noted that while the exemplary embodiments shown herein are directed to PDMS ridges supporting a membrane, the principles of the disclosure are not limited thereto. For example, the membrane can be supported by a plurality of posts which protrude from a surface to support the membrane. The posts can be formed by conventional processes or by processes disclosed herein. In this embodiment, the membrane is deposited over the posts so as to contact substantially the top portion of the posts. In another embodiments, cavities can be formed on the PDMS such that portions of the membrane are spanning over the cavities.

Figure 8B:
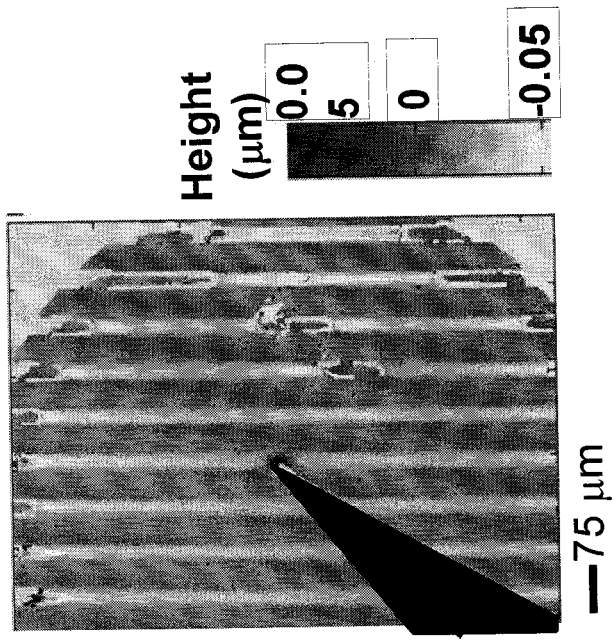
FIG. 8B shows the profile of a gold diaphragm of FIG. 8A when a bias is applied.
Figure 8A:
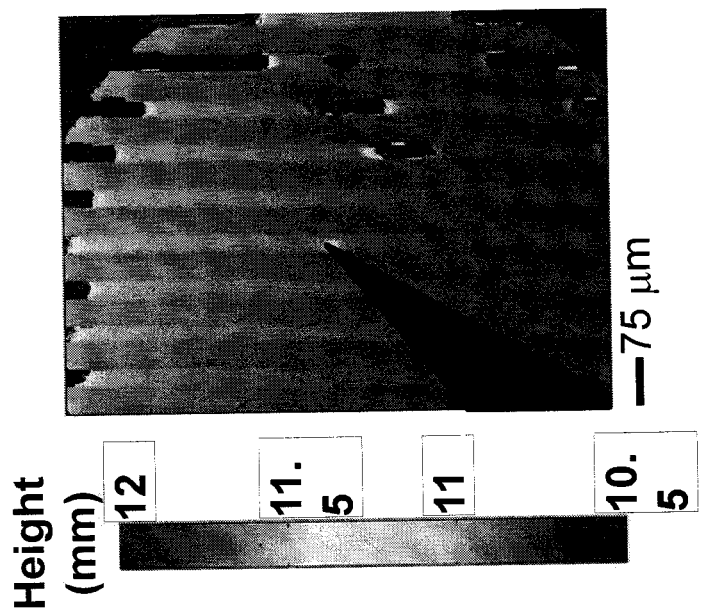
FIG. 8A shows the profile of a gold diaphragm on a MEMS structure with no bias.

A structure similar to that shown in FIG. 7C was tested by supplying biasing the structure. FIG. 8A shows the profile of the gold diaphragm on a MEMS structure with no bias. Here, the probe tip is not biased and the diaphragm height remains unchanged at about 11.7 µm. FIG. 8B shows the profile of a gold diaphragm of FIG. 8A when a 40V bias is applied. In FIG. 8B, the probe tip is biased to 40V and the height of the diaphragm drops to about 0.03 µm relative to the initial height. The deflection in the diaphragm can be measured by detecting the expansion or contraction of the supports or by the space of the cavity beneath the diaphragm.

The disclosed methodology can be applied to producing, among others, pressure-sensing arrays for turbulence detection/monitoring, microphone fabric for listening surfaces and sound source location and ultrasound microphone array for imaging. For a pressure sensing device, a membrane is transferred over a void space to form a sealed or semi-enclosed cavity such that a pressure differential can develop between the interior of the cavity and the exterior environment. Under an external force (i.e., static atmospheric pressure increase or dynamic pressure from sound or ultrasound waves), the pressure differential bows or deflects the membrane to cause a deflection that can be sensed through a change in capacitance. Precise geometry, including shape of membrane, thickness of membrane, size of void, are tailored to optimize sensitivity to the input frequency and bandwidth for a particular application.

In applications of pressure-sensing arrays, a flexible sensor fabric can be draped over (or adhered to) an object to allow spatially resolved pressure sensing to detect and map fluid or gas flows across the surface of an object. The sensor density achievable with the disclosed technique should allow detection and monitoring of turbulent eddies. This sensor fabric can be directly applied in wind tunnel testing of automobiles, aircraft, turbine blades, and buildings (model scale).

In applications of microphone fabrics, a sensor is constructed in view of the disclosed principles. The device geometry can be optimized such that the frequency response is sensitive in the range of audible sounds (i.e., 20 Hz-20 kHz) so that each individual sensor act as a microphone. Sound is detected over large areas to allow the so-called triangulation of the sound generator's origin. Such a fabric (diaphragm) can be used as a listening wall for surveillance or can be incorporated into responsive large area displays. A responsive display can track multiple users' voices and respond by changing the projected content on a screen according to user input.

Ultrasound microphone arrays built from the pressure-sensing arrays described above, with the additional optimization of device geometry such that the frequency response in sensitive in the range of ultrasound frequencies (i.e., greater than 20 kHz). Arrays of sensors tuned in the 1-20 MHz range could be used for medical ultrasound imaging. The conformal, flexible nature of devices produced by the contact transfer stamping process is particularly amenable to coating of catheters and endoscopes with sensor arrays for local, high resolution imaging of tissues and structures. Among others, this technology enables in vivo therapeutic ultrasound for, among others, treatment of thrombosis, targeted drug delivery, and tumor ablation. Beyond biomedical applications, ultrasound sensors are useful for non-destructive crack detection and monitoring in structural materials.

Figure 9:
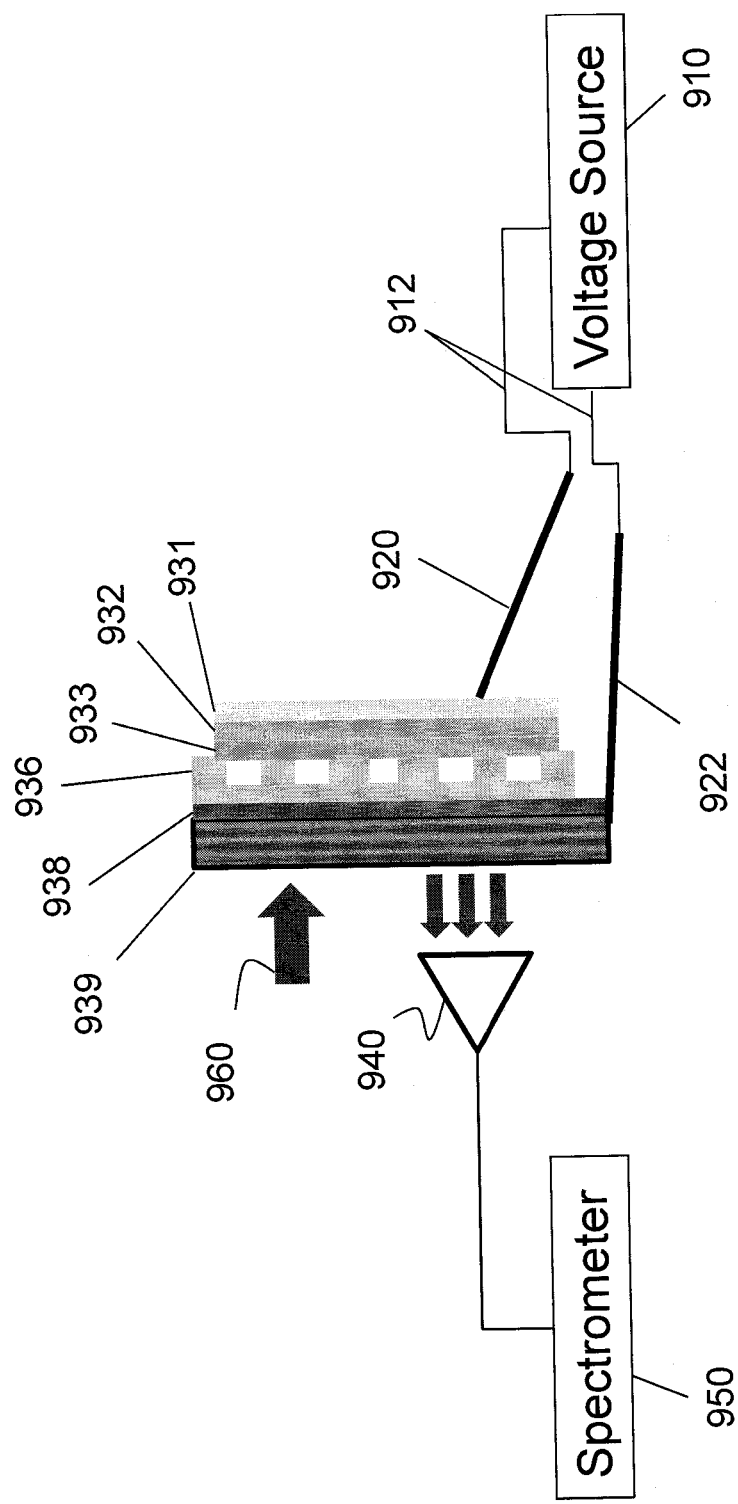
FIG. 9 illustrates a tunable emitter device according to an embodiment of the disclosure.

One such exemplary application is shown in FIG. 9 which illustrates a setup for testing a tunable emitter device according to an embodiment of the disclosure. The system of FIG. 9 comprises voltage source 910 which connects to electrodes (interchangeably, probes) 920 and 922, through wires 912. Electrode 920 communicates with a deformable mirror having layers 931, 932 and 933 which define, respectively, Au, Ag and $Al_{q3}$. Other layers can be used without departing from the disclosure. Posts 936 are formed on top of substrate layer 939. Posts 936 can define PDMS and substrate 939 can define DBR. Electrode 922 communicates with substrate layer 938. Electrode 920 communicates with the deformable mirrors. Laser signal 960 can be used to optically pump the device. Responsive to the laser signal, layer 933 emits light. Spectrometer 950 collects the emitted light through substrate layer 939. Amplifier 940 can optionally be used to amplify the signal exiting from substrate layer 939.

Figure 10:
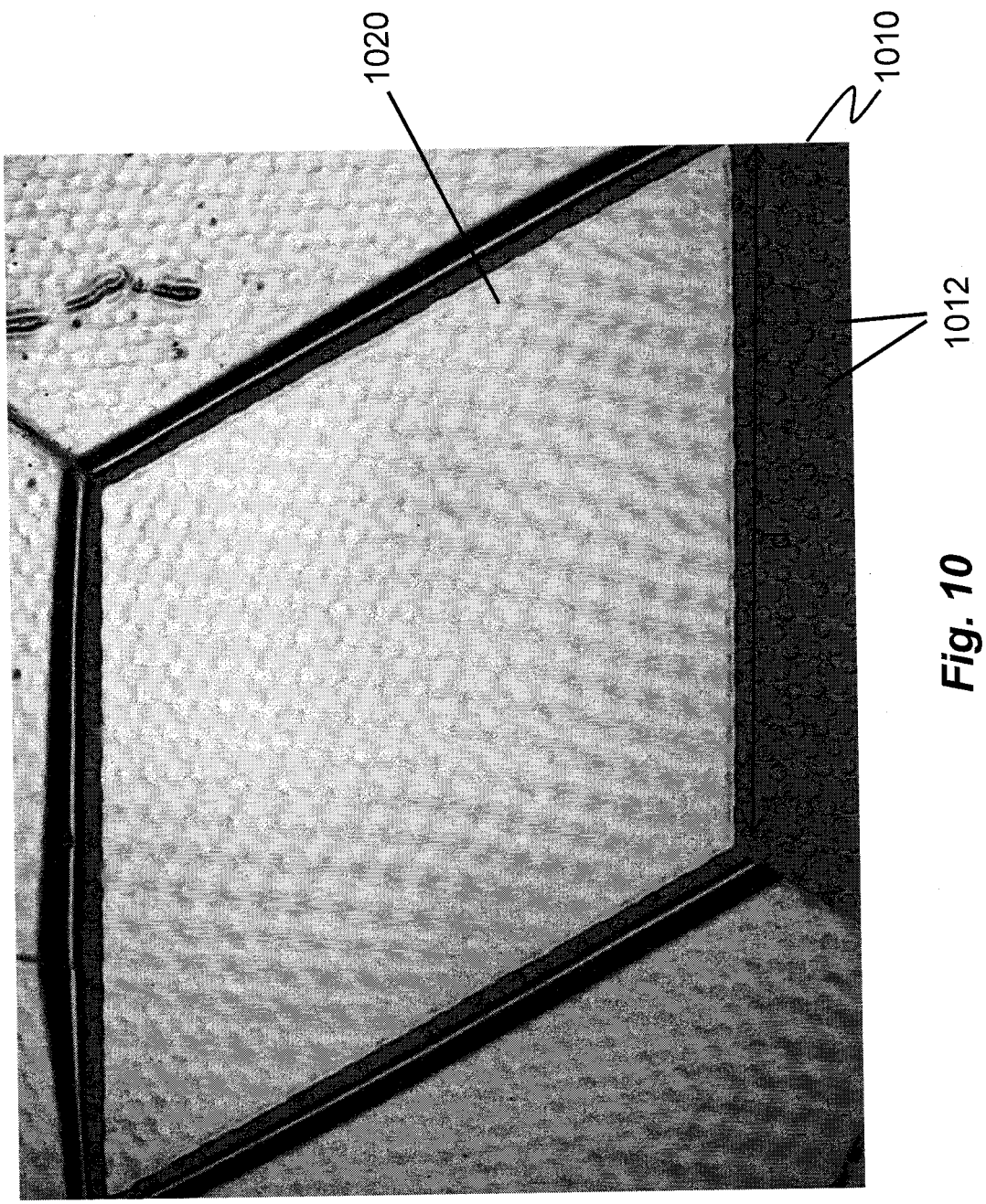
FIG. 10 shows an exemplary MEMS sensor for detecting minute changes in pressure.

FIG. 10 shows an exemplary MEMS sensor for detecting minute changes in pressure. In FIG. 10, substrate 1010 supports a plurality of cavities 1012. Cavities 1012 can range from 1-50 µm diameter. Gold membrane 1020 (interchangeably, diaphragm) was then formed over cavities 1012 such that the material surrounding the cavities support membrane 1020. In the exemplary embodiment of FIG. 10, diaphragm 1020 is shaped as a parallelogram with a side having length, d, of about 950 µm. Gold membrane 1020 was formed over posts 1012 by taking advantage of the transfer pad's geometry. Consequently, the edges of the parallelogram are straight and clean. When pressure is applied to diaphragm 1020, the affected regions of the diaphragm deflect into underlying cavities 1012, changing the capacitance of the structure. By positioning electrodes at or near substrate 1010 and diaphragm 1020, the expansion/contraction can be measured. Among others, the apparatus of FIG. 10 can be used as pressure sensor or acoustical detector.

Figure 11B:
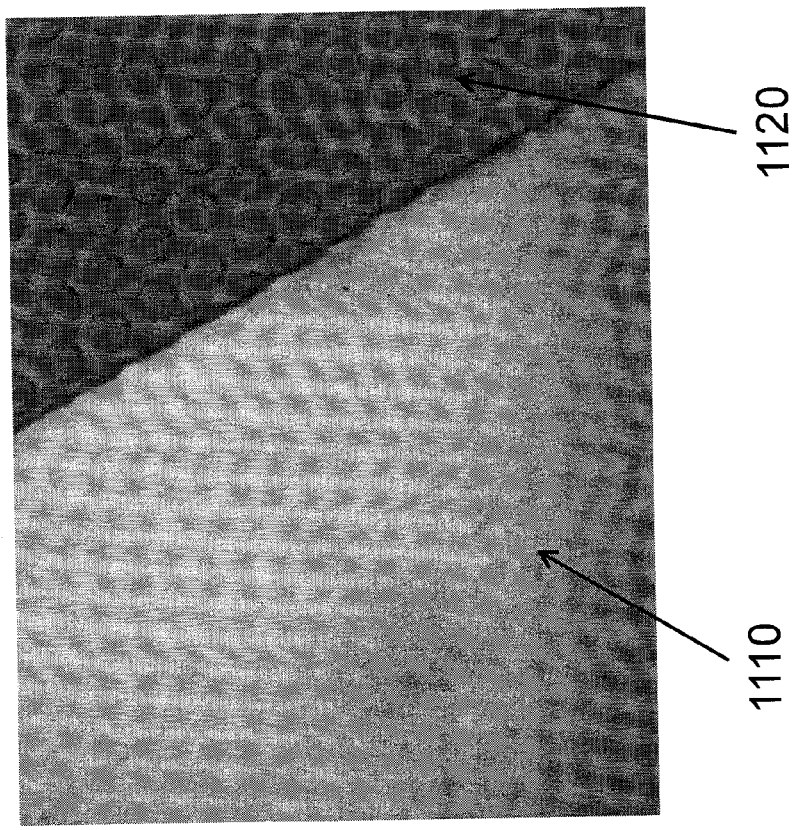
FIGS. 11A and 11B show the crack-free transfer of gold diaphragm (top electrode) in a pressures sensor according to an embodiment of the disclosure.
Figure 11A:
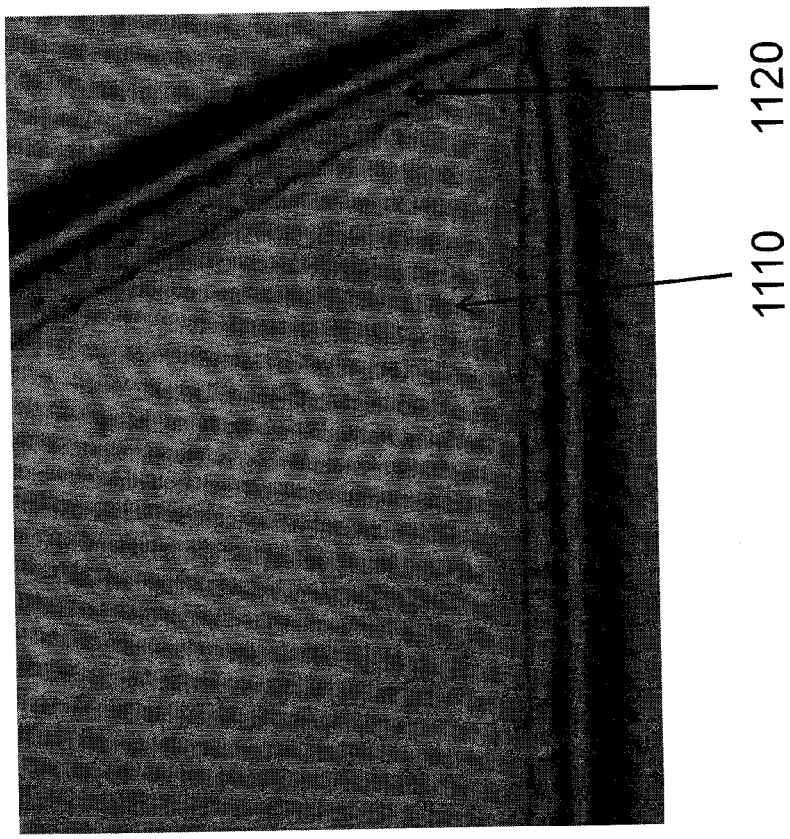

FIGS. 11A and 11B show the crack-free transfer of gold diaphragm (top electrode) in a pressures sensor according to an embodiment of the disclosure. A microscope was used to show the edges and the corners of the gold diaphragm. As seen in FIG. 11A, the sharp corner of diaphragm 1110 was transferred over substrate and cavities 1120 without any cracks and maintained their original shape. Similarly, in FIG. 11B, an edge of diaphragm 1110 overlaps the cavities without cracking or peeling which is the result of the disclosed principles. The resolution has been improved to about 5-10 micron.

By placing a light emitting material inside the cavity between two mirrors, the optical modes can be restricted and an electrically tunable emitter array can be constructed. Further, by using a bridge or membrane of reflective material as one of the mirrors, the height of the cavity can be electrically-tuned to change the allowed internal reflections. In one embodiment of the disclosure, an electrically-tunable optically pumped organic dye emitter was constructed by placing an organic molecular film within a cavity backed by a silver mirror surface.

Figure 12B:
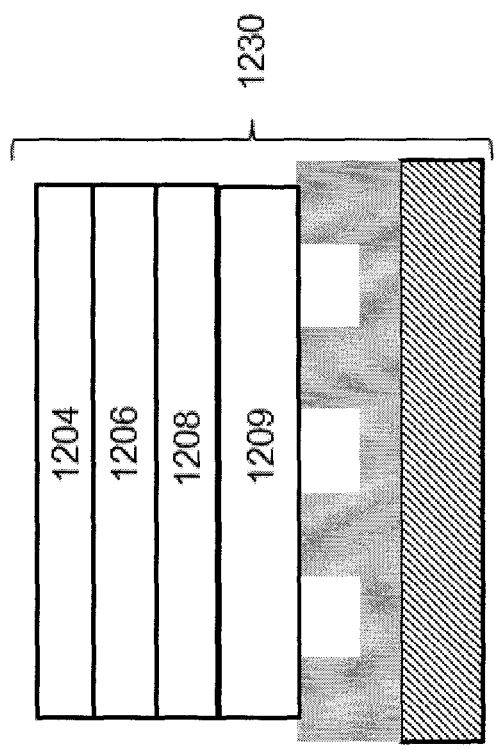
FIGS. 12A-12C schematically illustrate the construction of a deformable mirror.
Figure 12A:
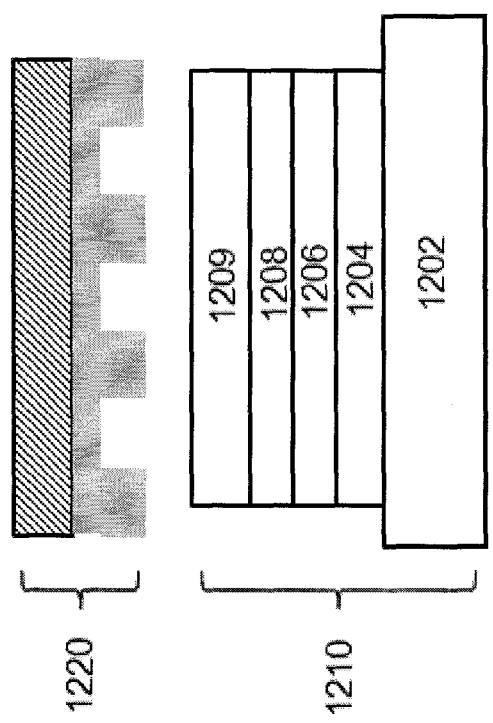
Figure 12C:
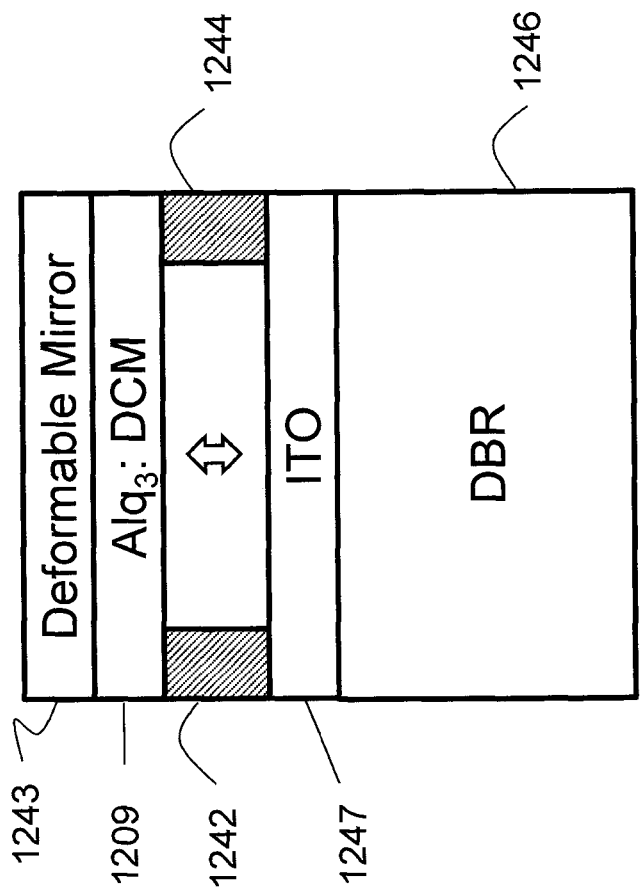

FIGS. 12A-12C schematically illustrate the construction of a deformable mirror. In FIG. 12A, plasma treated PDMS substrate 1202 had deposited thereon a 90 nm release layer (TPD) 1204, a 50 nm gold layer 1206 (acting as the crack-free seed layer), a 100 nm silver layer 1208 (reflective mirror) and $Alq_3$ organic dye layer 1209 (150 nm in thickness) to form multilayer 1210. Stamp 1220 (as described in FIG. 2) was constructed and brought in conformal contact with multilayer 1210. Structure 1230 resulted upon removal of the PDMS substrate. FIG. 12C schematically shows a full device structure between adjacent PDMS support structures 1242 and 1244. Distributed Bragg Reflector ("DBR") 1246 supports ITO layer 1247. Alternatively, the order of the DBR and ITO layers can be exchanged. Layers 1209 and 1243 rest on support structures 1242 and 1244 such that deformable mirror 1243 (comprising gold layer 1206 and silver layer 1208 in FIGS. 12A-12B) and $Alq_3$ layer 1209 (doped with DCM ((E)-2-(2-(4-(dimethylamino)styryl)-6-methyl-4H-pyran-4-ylidene)malononitrile)) can freely deflect responsive to an external force. The addition of DCM changes the emitted wavelength and promotes lasing. The deformable mirror may further comprise a multilayer structure having a gold film, a silver film and a DCM-doped organic dye layer. The organic dye can be selected to emit in one or more of the UV, visible or IR wavelengths. The mirror material can be selected to be reflective at the dye emission wavelength.

FIG. 13 is an optical micrograph of the tunable emitter geometry formed by a multilayer transfer according to an embodiment of the disclosure. Specifically, FIG. 13 shows an optically magnified multilayer transfers comprising gold, silver and $Alq_3$ layer doped with DCM. In FIG. 13, PDMS ridges support a multilayer structure which act as deformable mirror.

Texture morphing surfaces have many applications. For example, by actuating a transducer array, microscopic deflections can be controlled over an entire surface. The deflections can be used to shape, guide, focus or deflect the reflection of energy (e.g., light, sound, or fluids). When responsive to pressure or sound, the diaphragm material can be selected to be sensitive and responsive to frequency range of audible or ultrasound frequencies. The control of deflection allows the creation or damping of turbulence in flowing fluids such as mixing of fluids in microfluidic channels or reduction of gas boundary layer thickness around airfoils or other aerodynamic shapes. Alternatively, a controlled-texture surface could be used to provide tactile information to the user of a hand-held personal electronic device (i.e., location of keys on a screen keypad).

The disclosed embodiments can be used to construct actuators, transducer arrays for ultrasound frequencies, electrically-tunable laser/laser array and texture morphing surfaces. An actuator device can be constructed by transferring a membrane over one or more voids or cavities to create two electrodes separated by an air gap. The top electrode can be deformable. The construction and mode of operation are similar to the variable capacitor, however in these embodiments, the desired output is the mechanical deflection itself and not the variable capacitance. Deflection of the membrane can be achieved by application of a voltage differential between the deformable and fixed electrodes which cause electrostatic forces to draw the deformable electrode towards the fixed electrode.

Transducer arrays for ultrasound frequencies that are tuned to produce deflections at ultrasonic frequencies can be used to replace piezoelectric transducers. Piezoelectric transducers require high voltage and must dissipate large amounts of heat. Such devices are difficult to fabricate at high transducer density and cannot be formed on flexible substrates. The disclosed embodiments provide a similar output with high transducer density and membrane flexibility, conformability, and ease of processing. Flexibility and conformability are particularly important for endoscopic or catheter ultrasound imaging as well as in vivo therapeutic uses of ultrasound including treatment of thrombosis, targeted drug delivery and tumor ablation. Beyond biomedical applications, ultrasound transducers produced by contact transfer could provide the sound pulses needed for non-destructive crack detection and monitoring in structural applications (e.g., bridge supports, wheel axles, turbines, engine components.)

While the principles of the disclosure have been illustrated in relation to the exemplary embodiments shown herein, the principles of the disclosure are not limited thereto and include any modification, variation or permutation thereof.

What is claimed is:
1. A MEMS sensor, comprising:
a plurality of cavities projecting from a substrate, the plurality of cavities arranged in an array and each cavity having a hollow interior separating a top portion and a bottom portion of the cavity, each cavity defined by one or more posts;
a plurality of diaphragm layers formed over the array and supported by the one or more posts of each cavity;
a first electrode communicating with the plurality of diaphragms layers defining a plurality of complementary electrodes;
a meter in communication with the plurality of complementary electrodes for detecting a capacitance change between the at least one first electrode and its respective diaphragm when an external signal impacts the diaphragm.

2. The sensor of claim 1, further comprising a controller in communication with the meter, the controller having a processor circuit in communication with a memory circuit, the controller receiving a signal from the meter and identifying a pressure change corresponding to the received signal.

3. The sensor of claim 1, further comprising a controller in communication with the meter, the controller having a processor circuit in communication with a memory circuit, the controller receiving a signal from the meter and identifying a change in capacitance corresponding to the received signal.

4. The sensor of claim 1, wherein at least one of the complementary electrode pairs determines a change in potential between the first electrode and the diaphragm when the diaphragm is deflected.

5. The sensor of claim 1, wherein the diaphragm includes a conductive or a semi-conductive material.

6. The sensor of claim 1, wherein the plurality of cavities are formed on an elastomeric polymer.

7. The sensor of claim 1, wherein the plurality of diaphragm layers are about 13-20 nm.

8. The sensor of claim 1, wherein a pair of adjacent posts are separated by about 5-50 micrometers.

9. A MEMS apparatus, comprising:
   an array of sensors formed in a substrate, each sensor defined by one or more posts encompassing a cavity;
   a first electrode formed over the cavity of a first sensor;
   a second electrode formed at a distance from the first electrode;
   a detector in communication with the first electrode and the second electrode, the detector determining a distance change between the first electrode and the second electrode;
   wherein the first electrode includes a diaphragm deflecting responsive to an external signal and wherein the diaphragm has a thickness of less than 100 nm.

10. The apparatus of claim 9, wherein the diaphragm has a thickness of about 13-20 nm.

11. The apparatus of claim 9, wherein the diaphragm comprises layers of conductive and semi-conductive material.

12. The apparatus of claim 9, wherein the cavity is about 5-50 micrometers.

* * * * *